United States Patent
Rayaprolu et al.

(10) Patent No.: US 11,704,179 B2
(45) Date of Patent: Jul. 18, 2023

(54) REGRESSION-BASED CALIBRATION AND SCANNING OF DATA UNITS

(71) Applicant: Micron Technology, Inc., Boise, ID (US)

(72) Inventors: Vamsi Pavan Rayaprolu, San Jose, CA (US); Harish R. Singidi, Fremont, CA (US); Ashutosh Malshe, Fremont, CA (US); Sampath K. Ratnam, Boise, ID (US); Qisong Lin, El Dorado Hills, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 17/452,930

(22) Filed: Oct. 29, 2021

(65) Prior Publication Data
US 2022/0050735 A1     Feb. 17, 2022

Related U.S. Application Data

(63) Continuation of application No. 16/702,399, filed on Dec. 3, 2019, now Pat. No. 11,194,646.

(51) Int. Cl.
| | | |
|---|---|---|
| *G06F 11/07* | (2006.01) | |
| *G06F 11/10* | (2006.01) | |
| *G06F 11/30* | (2006.01) | |
| *G06F 3/06* | (2006.01) | |

(52) U.S. Cl.
CPC ............ *G06F 11/076* (2013.01); *G06F 3/064* (2013.01); *G06F 3/0616* (2013.01); *G06F 3/0646* (2013.01); *G06F 3/0653* (2013.01); *G06F 3/0679* (2013.01); *G06F 11/0757* (2013.01); *G06F 11/1068* (2013.01); *G06F 11/3058* (2013.01)

(58) Field of Classification Search
CPC ...... G06F 11/076; G06F 3/0616; G06F 3/064; G06F 3/0646; G06F 3/0653; G06F 3/0679; G06F 11/0757; G06F 11/1068; G06F 11/3058
See application file for complete search history.

(56) References Cited

U.S. PATENT DOCUMENTS

| | | | |
|---|---|---|---|
| 9,223,656 B2 | 12/2015 | Kim | |
| 9,524,790 B1 | 12/2016 | Steiner et al. | |
| 9,563,502 B1 | 2/2017 | Alhussien et al. | |
| 9,761,325 B1 | 9/2017 | Shi et al. | |
| 2010/0296350 A1 | 11/2010 | Kim et al. | |
| 2015/0043282 A1* | 2/2015 | Shin ................... | G11C 11/5642 365/185.21 |
| 2015/0085573 A1 | 3/2015 | Sharon et al. | |

(Continued)

*Primary Examiner* — Kyle Vallecillo
(74) *Attorney, Agent, or Firm* — Lowenstein Sandler LLP

(57) ABSTRACT

Read operations can be performed to read data stored at a data block. Parameters reflective of a separation between a pair of programming distributions associated with the data block can be determined based on the plurality of read operations. A read request to read the data stored at the data block can be received. In response to receiving the read request, a read operation can be performed to read the data stored at the data block based on the parameters that are reflective of the separation between the pair of programming distributions associated with the data block.

20 Claims, 6 Drawing Sheets

(56) References Cited

U.S. PATENT DOCUMENTS

| | | |
|---|---|---|
| 2015/0193302 A1 | 7/2015 | Hyun et al. |
| 2015/0200688 A1 | 7/2015 | Pan et al. |
| 2016/0170682 A1 | 6/2016 | Bakshi et al. |
| 2016/0276040 A1 | 9/2016 | Han et al. |
| 2017/0148510 A1 | 5/2017 | Bazarsky et al. |
| 2017/0271031 A1 | 9/2017 | Sharon et al. |
| 2017/0358346 A1 | 12/2017 | Zhang et al. |
| 2018/0068736 A1* | 3/2018 | Kim .................. G11C 29/028 |

\* cited by examiner

REGRESSION-BASED CALIBRATION AND SCANNING OF DATA UNITS

RELATED APPLICATION

This application is a continuation of U.S. patent application Ser. No. 16/702,399, filed Dec. 3, 2019, which is herein incorporated by reference in its entirety.

TECHNICAL FIELD

Embodiments of the disclosure relate generally to memory sub-systems, and more specifically, relate to regression-based calibration and scanning of data units.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
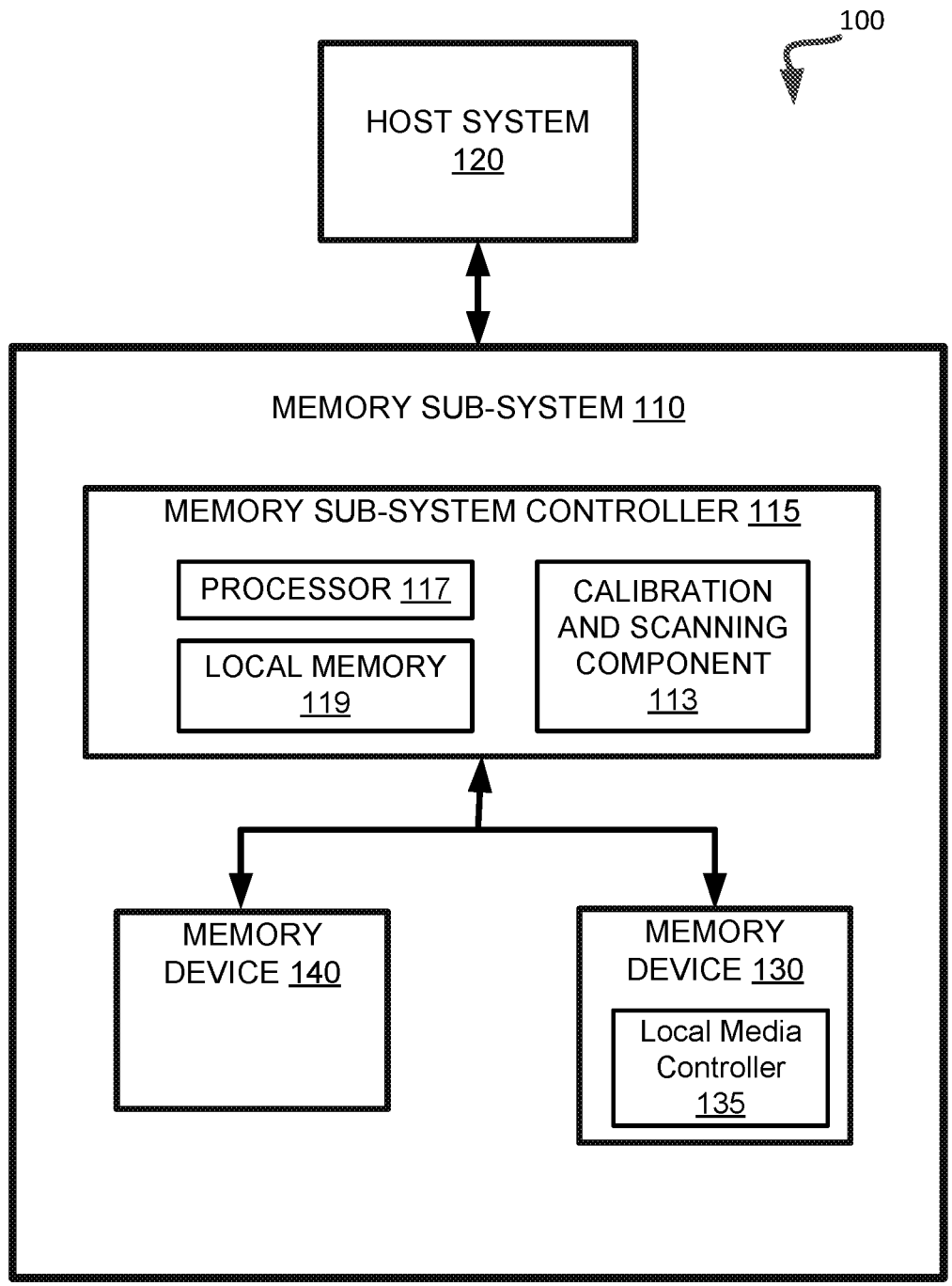
FIG. 1 illustrates an example computing environment that includes a memory sub-system in accordance with some embodiments of the present disclosure.

Aspects of the present disclosure are directed to regression-based calibration and scanning of data units. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

A memory device can be a non-volatile memory device. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells, which store bits of data. A data unit can refer to a block of data stored at the memory device (e.g., one or more memory pages, one or more memory blocks, etc.) Similarly, a data block hereinafter can refer to a unit of a memory device used to store data and can include a group of memory cells, a word line group, a word line, or individual memory cells.

As data is written to a memory cell of the memory device for storage, the memory cell, with time, can deteriorate. As memory cells deteriorate the overall health of the memory device can be adversely impacted, resulting in a higher error rate of the data stored in the memory device. Therefore, to monitor and address error rates in memory cells, the memory sub-system performs a data integrity check (also referred to herein as a "scan") to verify that the data stored at each memory cell does not include errors. During the data integrity check, one or more reliability statistics are determined for data stored at the memory. One common reliability statistic in conventional scanning mechanisms is raw bit error rate (RBER). The RBER corresponds to a number of bit errors per codeword that the data stored at the data block experiences. A codeword can refer to the smallest read unit allowed. The rate of RBER degradation can vary from one word line to another word line within the memory device and can also vary based on the read level voltage at which the memory cell can be read. Therefore, a scanning mechanism that utilizes multiple factors, in addition to the RBER rate, to make a determination as to the health of the data block is preferred.

Conventionally, common scanning practices have solely relied on the RBER rate at a reference read voltage in order to decide whether or not to refresh the data block. Refreshing the data block can refer to the process of copying the data from the data block being refreshed into a new data block, such that future operations of accessing the data can be performed against the new data block. For example, if the RBER rate of the data block determined at a predetermined read voltage level satisfies a predetermined threshold, the data block can be refreshed. While this scanning practice can improve data integrity, deciding to refresh a data block solely based on the RBER rate of the data block can result in unnecessary refreshing of data blocks. For example, as explained in more details herein below, the RBER rate can improve if the read voltage level, at which the RBER rate was determined, changes.

Another conventional approach has used static programming distributions to determine RBER of a memory cell based on the separation between the static programming distributions (e.g., valley) and based on data points collected from read operations of data in the memory cell. Because the static valley is not reflective of the current parameters describing the state of the memory cell, making a determination as to the health of the memory cell based on a static valley curve may not be accurate over time as the characteristics of the memory cell changes. Accordingly, a different scanning technique may be preferred to accurately detect errors based on multiple parameters that can be dynamically tuned, thus avoiding unnecessary corrective actions for memory blocks.

Aspects of the disclosure address the above and other deficiencies by implementing regression-based calibration and scanning of data units. In one implementation, regression-based calibration method can be used to perform a number of random read operations of a data block to collect certain parameters representative of a voltage difference between a pair of programming distributions associated with the data block (also referred to herein as a valley of the data block). A programming distribution can refer to the range of threshold voltages (e.g., normal distribution of threshold voltages) for programmed memory cells within the data block. The memory sub-system can then use these parameters as inputs to exponential equations to determine an ideal read level for the data block, based on the outcome of the equation. An ideal read level can refer to a read voltage that when applied at the time of reading data of a data block results in an error rate of the data block that is at a minimum value. Based on the outcome of the equation, a read voltage level for the data block can be updated, resulting in accurate data read and minimum error rate. In one implementation, the collected parameters can include a width of the valley, an ideal read position, and an RBER floor at the ideal read position.

In certain implementations, the calibration method can be performed continuously in the background as the data block is accessed by the host. In this case, the collection of data required for the calibration can take place when the host system is accessing the data. Alternatively, the collection of data can be initiated by the memory sub-system for the purpose of running regression tests. In an implementation, the calibration method can be performed in response to an occurrence of an event (e.g., in response to an error rate that is higher than a predetermined value). Over time, the data block can start to deteriorate and the calibration parameters that were originally collected can be adjusted to reach a new ideal read position for the data block. In this case, the calibration method can determine that the parameters representative of the valley of the data block can be updated (e.g., by determining that the error rate of the data block at the original read position is higher than a threshold). The calibration method can then perform a new set of read operations to determine new parameters representative of a valley and can update the original parameters accordingly.

In an implementation, regression-based scanning method can be used to ensure data integrity of data stored at the data block. The scanning method can utilize the calibration parameters that were determined during the calibration process of the data block as a baseline. The scanning method can then perform a number of read operations of data stored at the data block, at a configurable rate, based on original valley parameters that were collected during the calibration process. Based on data from the read operations, the memory sub-system can determine a second set of parameters that are representative of the current valley of the data block. If the original parameters are outside an expected variance from the second set of parameters, (e.g., the shape of the valley changed beyond an acceptable variance), the memory sub-system can determine that the data block can be refreshed because it may not be in a correctable state. The memory sub-system can then copy the data stored in the data block to another data block.

Performing regression-based calibration and scanning of data blocks can result in a more accurate determination of the health of the data block. Because regression-based calibration provides a feedback loop to adjust multiple parameters for error rate determination over time, the rate of refreshing data blocks can be reduced since more data blocks can continue to be in use by adjusting the read position for read operations of those data blocks. Thus, the performance of the memory sub-system can be increased as more read operations or write operations can be performed instead of additional refresh operations. Latencies of the system can also be improved because fewer error handling operations may be performed during the memory sub-system's active operation. Additionally, as a data block deteriorates over time, the calibration parameters can be dynamically adjusted to keep the data block performing at an optimal read level even as the voltage distribution of the data block changes with repeated access, aging of the data block, etc. As a result, the error rate of the memory sub-system can be reduced.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory and 3D cross-point type are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a regression-based calibration and scanning component 113 that can perform calibration and scanning of data in the data block based on multiple parameters that are representative of a voltage difference between a pair of programming distributions associated with the data block (also referred to herein as a valley of the data block). A programming distribution can refer to the range of threshold voltages (e.g., normal distribution of threshold voltages) for programmed memory cells within the data block. The parameters representative of the valley can include a width of the valley (W), a read level threshold voltage at the center of the valley (C), and an RBER floor at the center of the valley (F). In some embodiments, the memory sub-system controller 115 includes at least a portion of the regression-based calibration and scanning component 113. For example, the memory sub-system controller 115 can include a processor 117 (processing device) configured to execute instructions stored in local memory 119 for performing the operations described herein. In some embodiments, the regression-based calibration and scanning component 113 is part of the host system 110, an application, or an operating system.

The regression-based calibration and scanning component 113 can utilize the calibration parameters W, C, and F as inputs to an exponential equation to determine an ideal read level for the data block, based on the outcome of the equation. An ideal read level can be a read voltage applied at the time of reading data of a data block, such that the error rate of the data block is at a minimum or lower value. Based on the outcome of the equation, a read voltage level for the data block can be adjusted, resulting in improved results and minimized error rate. The values of W, C, and F parameters associated with the data block can be stored such that it can be utilized at subsequent read or scan operations of data stored at the data block to improve accuracy of the data read operation.

In certain implementations, when memory sub-system 110 receives a read request to read the data stored at the data block, memory sub-system 110 can perform a read operation of the data stored at the data block based on the calibration parameters W, C, and F that are associated with the data block. For example, the memory sub-system 110 can determine a read voltage level based on the calibration parameters and can perform the read operation using the read voltage level. Moreover, the memory sub-system 110 can update the calibration parameters of the data block if a certain condition is satisfied. In one example, the memory sub-system can determine that the error rate of the data block when read at the current W, C, and F values, is higher than a predetermined threshold. The memory sub-system can then perform a new set of read operations of data stored at the data block (e.g. by taking randomized sampling of data in the data block) and can determine new values for W, C, and F calibration parameters of the data block. The memory sub-system can then update the stored calibration parameters for the data block with the new set of W, C, and F values.

In an implementation, memory sub-system 110 can perform scans of the data stored at the data block to ensure data integrity of the data. The scanning operation can utilize the calibration parameters W, C, and F that were determined during the calibration process of the data block as a baseline. The scanning operation can then perform a number of read operations of data stored at the data block based on the calibration parameters W, C, and F. The scanning rate of the data stored at the data block can be configurable based on the health of the data block, such that the number of samples utilized when the RBER of the data block is below a certain threshold is lower than the number of samples utilized when the RBER of the data block is above the threshold, thus minimizing the overhead of the scanning process when the data block is considered healthy. Based on the read operations, memory sub-system 110 can determine a second set of values for parameters W, C, and F that are representative of the valley of the data block at the time of the scan. If the original values of W, C, and F parameters are outside an expected variance from the second set of values for the parameters, (e.g., the shape of the valley changed beyond an acceptable variance), the memory sub-system 110 can determine that the data block can be refreshed because the data block may not be in a correctable state. The memory sub-system 110 can then copy the data stored in the data block to another data block. Further details with regards to the operations of the calibration and scanning component 113 are described below.

Figure 2:
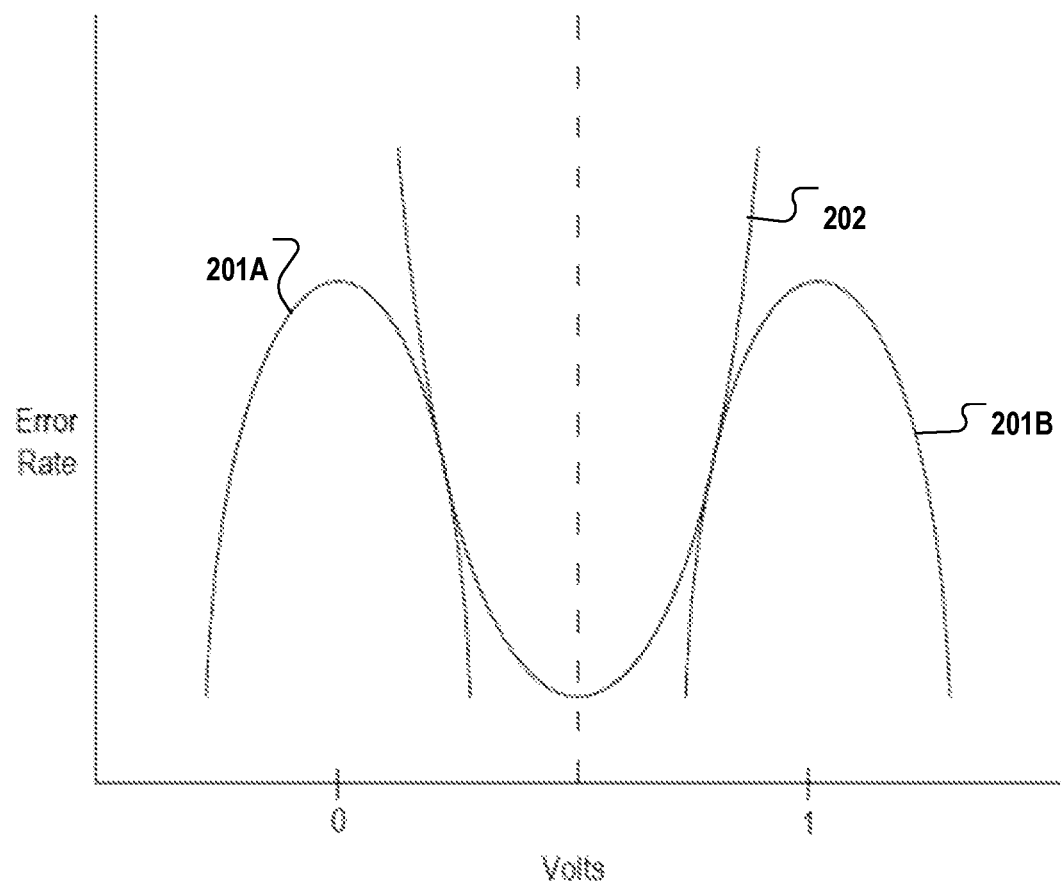
FIG. 2 illustrates an example of adjacent programming distributions and the separation between them, in accordance with some embodiments of the present disclosure

FIG. 2 illustrates an example of adjacent programming distributions and the separation between them, in accordance with some embodiments of the present disclosure. A data block with multi-level memory cells (e.g., TLC) stores TLC information using multiple bits of data per cell. For simplicity, FIG. 2 shows two adjacent programming distributions for a memory cell, programming distribution 201A representing a logical value of 000, and programming distribution 201B representing a logical value of 001. As illustrated in FIG. 2, between the two programming distributions 201A-B is a valley 202 representing the separation between the two distributions. In some embodiments, valley 202 represents the RBER observed in a data block based on the placement of the read voltage on the X-axis. The programming distribution 201A can represent the number of memory cells that store a voltage that represents the logical value of 000 and a respective error rate for the memory cells of the programming distribution 201A. Furthermore, the programming distribution 201B can represent the number of memory cells that store a voltage that is to represent the logical value of 001 and a respective error rate for the memory cells of the programming distribution 201B. As described herein, the regression-based calibration and scanning component 113 can determine the width of valley 202 over time and can make a determination as to the health of the memory cell. For example, if the width of the valley gets narrower than a threshold, the calibration and scanning component 113 can determine that the memory cell can be refreshed. On the other hand, if the calibration and scanning component 113 determines that the width of the valley is at least equal to the threshold, the calibration and scanning component 113 can adjust the calibration parameters of the memory cell to improve the error rate without refreshing the memory cell prematurely. Further, the calibration and scanning component 113 can generate valley 202 dynamically using exponential equations and calibration parameters that are reflective of the valley as inputs to the exponential equations, as explained in more detail herein. The calibration parameters that are reflective of the valley are explained in more details in FIG. 3.

Figure 3:
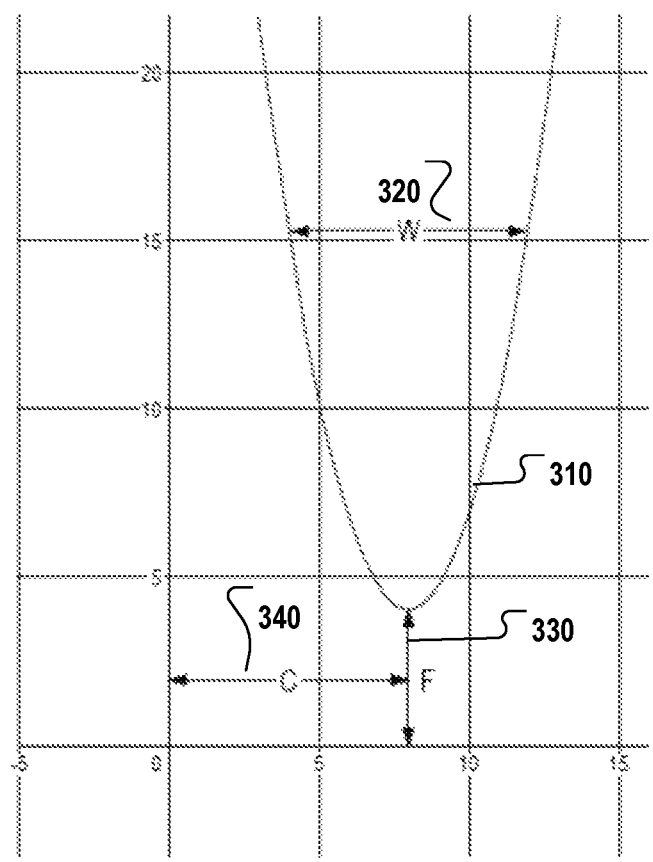
FIG. 3 illustrates an example of calibration parameters reflective of a valley curve, in accordance with some embodiments of the present disclosure

FIG. 3 illustrates an example of calibration parameters reflective of a valley curve, in accordance with some embodiments of the present disclosure. In one implementation, the valley or the data block can be represented by multiple parameters that can be used to determine the shape of the valley. In one example, the parameters can be W 320 that is representative of a width of the valley, C 340 that is a read level threshold voltage at the center of the valley, and F 330 that is an RBER floor at the center of the valley. W 320 can be indicative of the voltage range of the valley width and can be represented by the average slope of the valley, for example.

In order to determine the W, C, and F parameters for a data block, the calibration and scanning component 113 can perform a number of read operations at random voltage levels within the valley of the data block. The calibration and scanning component 113 can then use the data points to determine the programming distributions of the data block, and consequently determine the valley between two adjacent programming distributions. Based on the valley that is determined by the data points from the random read operations, the calibration and scanning component 113 can determine the center of the valley as C 340, a representation of the width of the valley (e.g., a value driven from the slope of the valley) as W 320, and the RBER floor of the valley at the center as F 330. The calibration and scanning component 113 can store the W, C, and F are reflective of the valley such that they can be used in subsequent read operations of the data stored in the data block (e.g., to adjust a read level threshold for reading data of the data block).

In one implementation, the exponential equation representing the valley 310 can be a polynomial equation representing a symmetrical curve for the valley. For example, the following equation can be used to generate valley 310:

$$Y=W*(X-C)^2+F$$

Where Y is the RBER at X, W is a value derived from the width of the valley (W 320), C is a read level threshold voltage at the center of the valley (C 340), and F is an RBER floor at the center of the valley (F 330). In an implementation, when the calibration and scanning component 113 receives a read request to read the data stored at the data block, the calibration and scanning component 113 can utilize the exponential equation above to determine a read level threshold that results in a minimum RBER. The calibration and scanning component 113 can use that read level threshold for reading the requested data.

In certain implementations, if the value of F 330 satisfies a threshold (e.g., the value is equal to or higher than a threshold value), the calibration and scanning component 113 can determine that the data block can be refreshed because the minimum error rate is unacceptable to achieve data reliability. Similarly, if the value of W 320 satisfies a threshold (e.g., the value of W is less than a threshold width), the calibration and scanning component 113 can determine that the data block can be refreshed because the valley margin of the data block is not in a healthy state. On the other hand, if the values of F 330 and W 320 are within an acceptable range but the RBER determined by a read operation is higher than a threshold, the calibration and scanning component 113 can determine that the data block is healthy and can continue to be in use by the host, but the read level can be shifted. The calibration and scanning component 113 can then update the read level threshold, according to the exponential equation of the valley, to achieve an improved RBER when reading the data stored at the data block.

Figure 4:
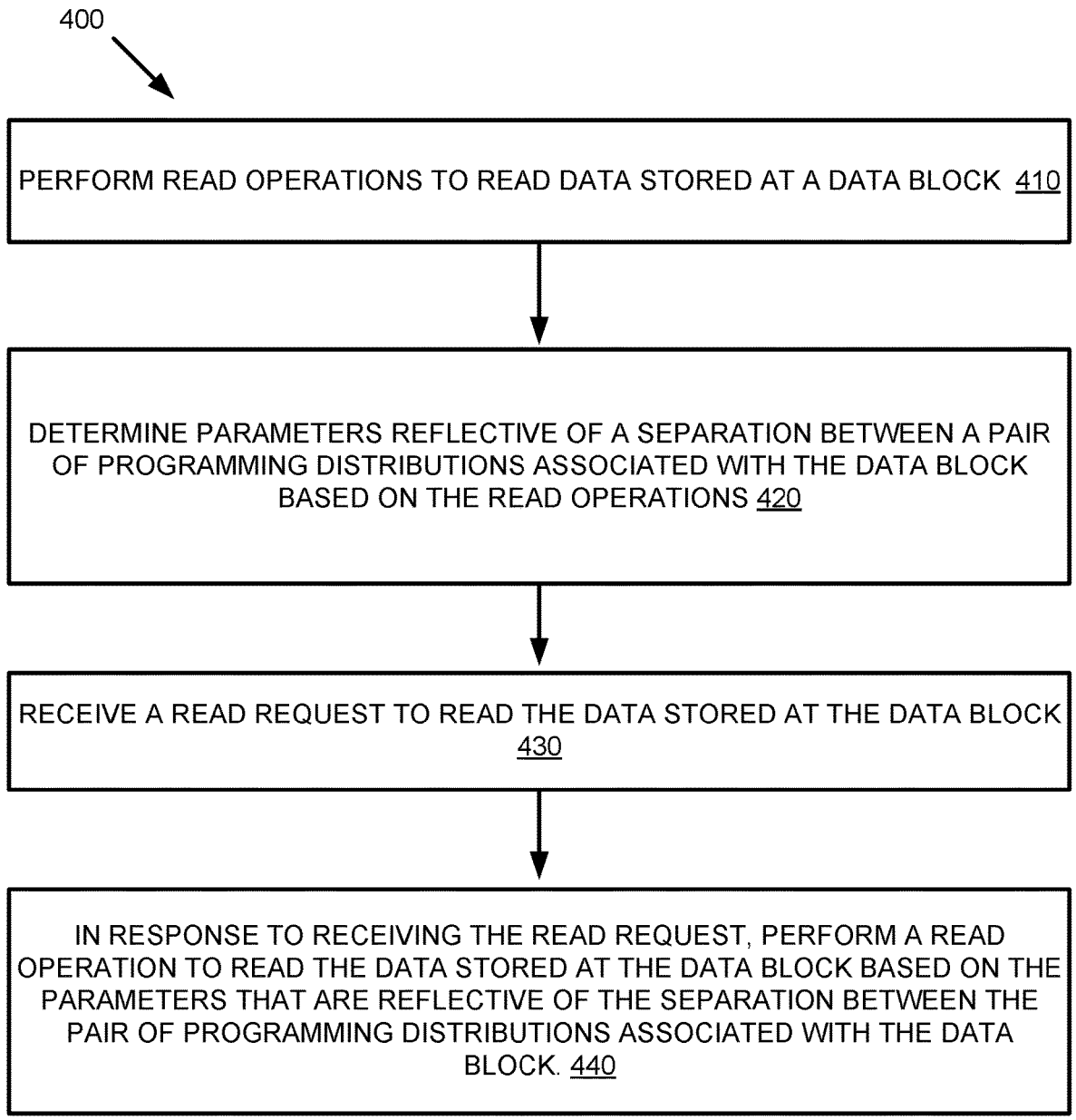
FIG. 4 is a flow diagram of an example method for performing regression-based calibration of a data block in accordance with some embodiments of the present disclosure.

FIG. 4 is a flow diagram of an example method for performing regression-based calibration of a data block in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the calibration and scanning component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device performs read operations to read data stored at a data block. The processing device can perform the read operations responsive to receiving an indication of a condition associated with the data block. In certain implementations, the condition can correspond to an elapsed time period or an error rate satisfying a threshold. For example, a recurring calibration of the data block can trigger read operations periodically based on a certain schedule (e.g., every 1 minute). On the other hand, an event-triggered calibration of the data block can trigger read operations when an RBER that satisfies a threshold is detected. For example, the RBER can be considered to satisfy the threshold when the RBER is equal to or exceeds a threshold RBER value. Responsive to determining that the condition associated with the data block has been satisfied, the processing device performs the read operations.

At operation 420, the processing device determines parameters reflective of a separation between a pair of programming distributions (also referred to herein as a valley of the data block) associated with the data block based on the read operations. A programming distribution can refer to the range of threshold voltages (e.g., normal distribution of threshold voltages) for programmed memory cells within the data block. In one implementation, the parameters reflective of the valley can include a width of the valley, a read position at the center of the valley, and an RBER floor at the center read position. The processing device can use data points from the read operations to determine the programming distributions of the data block, and consequently determine the valley between two adjacent programming distributions. Based on the valley that is determined by the data from the read operations, the processing logic can determine the center of the valley, a representation of the width of the valley (e.g., a value driven from the slope of the valley), and the RBER floor of the valley at the center.

Figure 5:
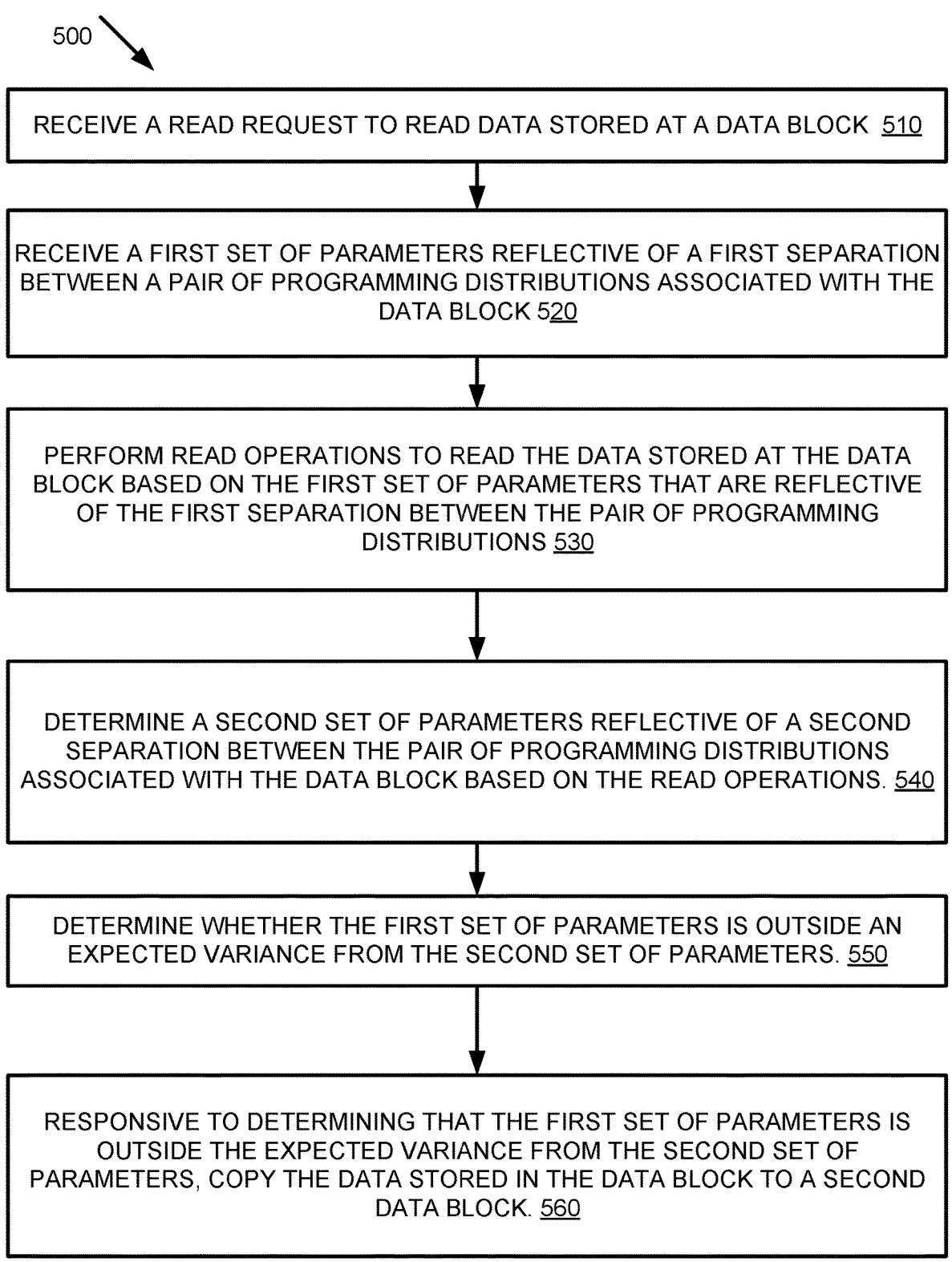
FIG. 5 is a flow diagram of an example method for performing regression-based scanning of a data block in accordance with some embodiments of the present disclosure

At operation 430, the processing device receives a read request to read the data stored at the data block. In an implementation, the read request can be initiated by a host system associated with the memory sub-system while accessing the data block. Alternatively, the read request can be initiated by the memory sub-system for the purpose of regression testing. In response to receiving the read request, at operation 440, the processing device performs a read operation to read the data stored at the data block based on the parameters that are reflective of the valley associated with the data block. For example, if the processing logic determines that the floor of the valley and the width of the valley are within an acceptable range but the RBER determined by the read operation is higher than a threshold, the processing logic can determine that the data block is healthy and can continue to be in use by the host system, but the read level can be shifted. The processing logic can then update the read level threshold, according to the exponential equation of the valley, to achieve an improved RBER when reading the data stored at the data block. For example, the voltage of the read level threshold used for the read operation can be changed to the voltage that is associated with the minimum RBER as represented by the exponential equation of the valley FIG. 5 is a flow diagram of an example method for performing regression-based scanning of a data block in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the calibration and scanning component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device receives a read request to read data stored at a data block. At operation 520, the processing device receives a first set of parameters reflective of a first separation between a pair of programming distributions (e.g., a valley) associated with the data block. In one example, the first set of parameters reflective of the valley can be determined during an earlier calibration process and can be retrieved from storage during the scanning process. In one implementation, the first set of parameters reflective of the valley can include a width (W) of the valley, a read position at the center (C) of the valley, and an RBER floor of the valley (F) at the center read position.

At operation 530, the processing device performs the scanning process by performing read operations to read the data stored at the data block based on the first set of parameters that are reflective of the first separation between the pair of programming distributions. In an implementation, the scanning rate of the data block data can be configurable based on the health of the data block. Scanning rate can refer to the number of samples, represented by the number of read operations, performed during a scanning process. The scanning rate can be configurable such that the number of samples utilized when the RBER of the data block is below a certain threshold is lower than the number of samples utilized when the RBER of the data block is above the threshold, thus minimizing the overhead of scanning when the data block is considered healthy.

At operation 540, the processing device determines a second set of parameters reflective of a second valley associated with the data block based on the read operations. In an implementation, the processing device can determine a second set of values for parameters W, C, and F that are representative of the valley of the data block at the time of the scan. The second set of values for W, C, and F can be determined based on the read operations, such that data points from the read operations can be utilized to determine the programming distributions of the data block, and consequently determine the valley between two adjacent programming distributions. Based on the valley that is determined by the data from the read operations, the processing logic can determine the center of the valley (C), a representation of the width of the valley (e.g. a value driven from the slope of the valley) (W), and the RBER floor of the valley at the center (F).

At operation 550, the processing logic determines whether the first set of parameters is outside an expected variance from the second set of parameters. In an implementation, If the first set of values of W, C, and F parameters are outside an expected variance from the second set of values for the parameters, (e.g. the shape of the valley changed beyond an acceptable variance), the processing device can determine that the data block can be refreshed because it may not be in a correctable state. For example, an expected variance can refer to a condition where the change in value of at least one parameter of the W, C, and F parameters satisfies a threshold. In some embodiments, a parameter can be considered to satisfy the threshold when a value of the parameter is equal to or exceeds a threshold difference from an expected or prior value. This variance between the original valley of the data block and the current valley of the data block can indicate that the data block may not be in a healthy or correctable state.

At operation 560, responsive to determining that the first set of parameters is outside the expected variance from the second set of parameters, the processing device copies the data stored in the data block to a second data block. In an implementation, the original data block can be marked as retired such that it cannot be used to store subsequent data from the host system, and future access of the data can be performed against the second data block.

Figure 6:
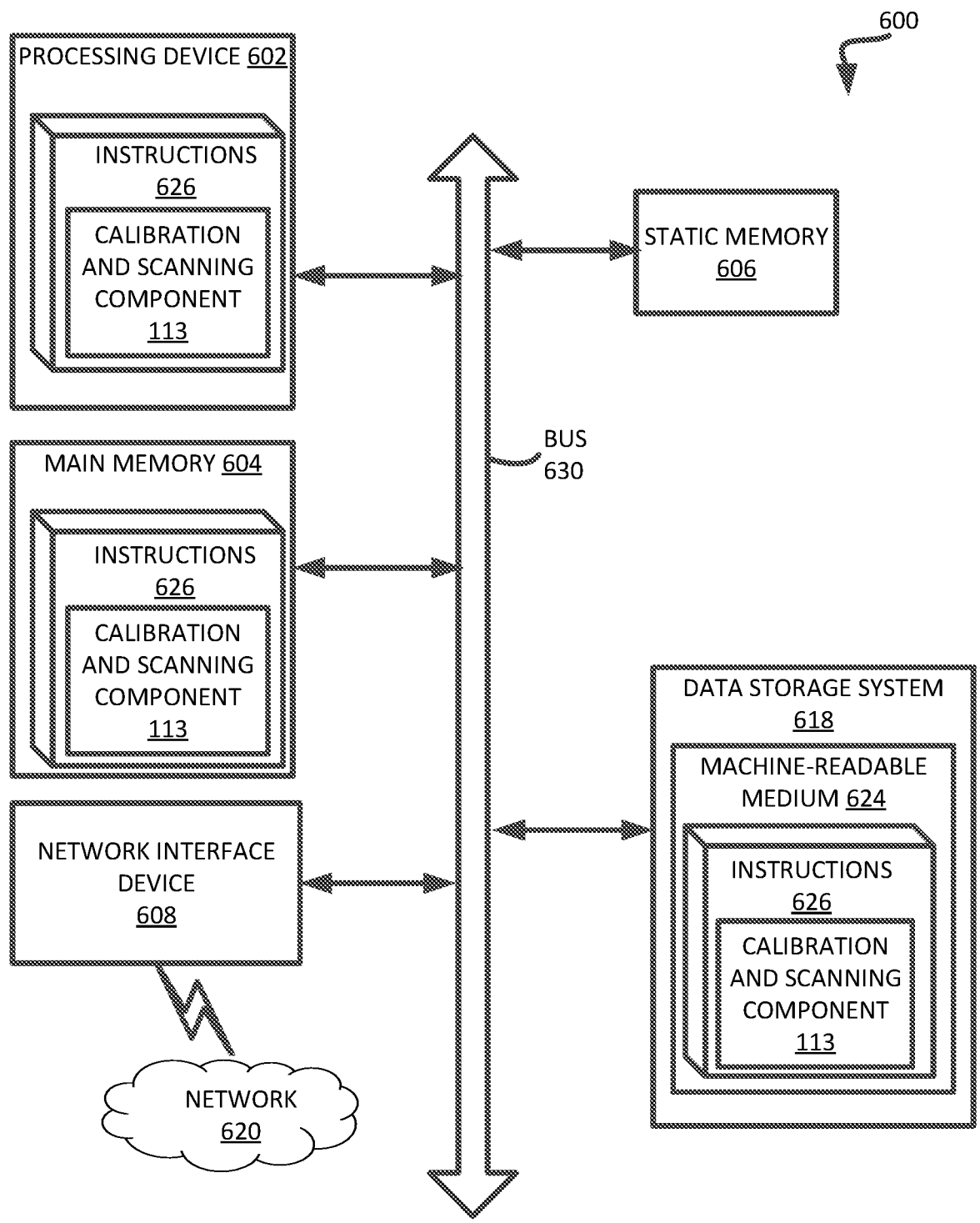
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the calibration and scanning component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a calibration and scanning component (e.g., the calibration and scanning component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to:
in response to satisfying at least one of: an elapsed time period or error rate, performing a plurality of read operations to read data stored at a data block;
determining, by the processing device, based on the plurality of read operations, a width of a valley associated with the data block;
receiving a read request to read the data stored at the data block; and
in response to receiving a read request, performing a read operation, using the width of the valley, to read the data stored at the data block.

2. The system of claim 1, wherein the valley is a voltage difference between pairs of adjacent programming distributions associated with the data block.

3. The system of claim 1, wherein performing the read operation to read the data stored at the data block further comprises:
determining a read voltage level based on the width of the valley; and
performing the read operation using the read voltage level.

4. The system of claim 1, wherein to perform the plurality of read operations, the processing device is further to:
determining the error rate associated with performing the read operation to read the data stored at the data block; and
in response to determining that the error rate satisfies a threshold error rate, updating the width of the valley based on another plurality of read operations to read the data stored at the data block.

5. The system of claim 1, wherein the width of the valley is further reflected by an equation with a plurality of parameters as input values to the equation.

6. The system of claim 5, wherein the equation is at least one of a first equation to represent the valley as a symmetrical curve or a second equation to represent the valley as an asymmetrical curve.

7. The system of claim 1, wherein the width of the valley is a width of a separation between a pair of programming voltage distributions associated with the data block.

8. A non-transitory computer-readable storage medium comprising instructions that, when executed by a processing device, cause the processing device to:
perform a plurality of read operations at random voltage levels between a pair of programming distributions associated with a data block;
determine, based on the plurality of read operations at random voltage levels between a pair of programming distributions associated with the data block, a pair of programming voltage distributions associated with the data block;
determine, based on a valley associated with the pair of programming voltage distributions associated with the data block, a first center of the valley, a first width of the valley, and a first residual bit error rate (RBER) floor of the valley; and
in response to receiving a read request, perform a read operation, using the first center of the valley, the first width of the valley, and the first RBER floor of the valley, to read a data stored at the data block.

9. The non-transitory computer-readable storage medium of claim 8, wherein the valley is a voltage difference between the pairs of programming voltage distributions that are adjacent associated with the data block.

10. The non-transitory computer-readable storage medium of claim 8, further cause the processing device to:
in response to performing the read operation, using the first center of the valley, the first width of the valley, and the first RBER floor of the valley, to read the data stored at the data block, determine a second center of the valley, a second width of the valley, and an second RBER floor of the valley.

11. The non-transitory computer-readable storage medium of claim 10, further cause the processing device to:
determine whether the first center of the valley, the first width of the valley, and the first RBER floor of the valley is outside an expected variance from the second center of the valley, the second width of the valley, and the second RBER floor of the valley.

12. The non-transitory computer-readable storage medium of claim 8, wherein the first width of the valley is further reflected by an equation with a plurality of parameters as input values to the equation.

13. The non-transitory computer-readable storage medium of claim 12, wherein the equation is at least one of a first equation to represent the valley as a symmetrical curve or a second equation to represent the valley as an asymmetrical curve.

14. A method comprising:
in response to satisfying at least one of: an elapsed time period or error rate, performing a plurality of read operations to read data stored at a data block;
determining, by a processing device, based on the plurality of read operations, a width of a valley associated with the data block;
receiving a read request to read the data stored at the data block; and
in response to receiving a read request, performing a read operation, using the width of the valley, to read the data stored at the data block.

15. The method of claim 14, wherein the valley is a voltage difference between pairs of adjacent programming distributions associated with the data block.

16. The method of claim 14, wherein performing the read operation to read the data stored at the data block further comprises:
determining a read voltage level based on the width of the valley; and
performing the read operation using the read voltage level.

17. The method of claim 14, wherein to perform the plurality of read operations, the processing device is further to:
determining the error rate associated with performing the read operation to read the data stored at the data block; and
in response to determining that the error rate satisfies a threshold error rate, updating the width of the valley based on another plurality of read operations to read the data stored at the data block.

18. The method of claim 14, wherein the width of the valley is further reflected by an equation with a plurality of parameters as input values to the equation.

19. The method of claim 18, wherein the equation is at least one of a first equation to represent the valley as a symmetrical curve or a second equation to represent the valley as an asymmetrical curve.

20. The method of claim 18, wherein the width of the valley is a width of a separation between a pair of programming voltage distributions associated with the data block.

* * * * *